United States Patent
Hung et al.

(10) Patent No.: US 9,456,536 B2
(45) Date of Patent: Sep. 27, 2016

(54) METHOD FOR PINS DETECTION AND INSERTION OF ELECTRONIC COMPONENT

(71) Applicant: Industrial Technology Research Institute, Hsin-Chu (TW)

(72) Inventors: Kuo-Feng Hung, Taoyuan County (TW); Yung-Jung Chang, Hsinchu (TW); Yen-Chia Peng, Tainan (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 261 days.

(21) Appl. No.: 14/074,960

(22) Filed: Nov. 8, 2013

(65) Prior Publication Data

US 2014/0130341 A1 May 15, 2014

(30) Foreign Application Priority Data

Nov. 9, 2012 (TW) .............................. 101141808 A

(51) Int. Cl.
*H05K 13/00* (2006.01)
*H05K 13/08* (2006.01)
*H05K 3/30* (2006.01)

(52) U.S. Cl.
CPC .......... *H05K 13/0015* (2013.01); *H05K 13/08* (2013.01); *H05K 3/306* (2013.01); *Y10T 29/49004* (2015.01); *Y10T 29/53174* (2015.01)

(58) Field of Classification Search
CPC .... H01R 43/04; H01R 43/048; H01R 43/20; H01R 43/205; H05K 3/306; H05K 13/0015; H05K 13/08; Y10T 29/49004; Y10T 29/53174
See application file for complete search history.

(56) References Cited

U.S. PATENT DOCUMENTS 2,804,806 A 9/1957 Simpson
3,852,865 A * 12/1974 Ragard .............. H05K 13/0053
29/56.6

(Continued)

FOREIGN PATENT DOCUMENTS

CN 1325612 A 12/2001
CN 101031199 9/2007

(Continued)

OTHER PUBLICATIONS

SIPO State Intellectual Property Office of the People's Republic of China, "Office Action" issued Dec. 31, 2015.

(Continued)

*Primary Examiner* — Carl Arbes
(74) *Attorney, Agent, or Firm* — WPAT, PC; Justin King; Jonathan Chiang

(57) ABSTRACT

A method and system for pins detection and insertion of an electronic component are provided. The method includes picking an electronic component having a plurality of pins by a pick and place device, acquiring a plurality of serial images with respect to the plurality of pins at different height along an image acquiring direction by an image acquiring device, separately detecting image positions corresponding to the plurality of pins in the plurality of serial images, determining whether the electronic component is qualified according to a distance between the image positions of two adjacent pins, and if the electronic component is qualified, inserting the electronic component to a circuit board according to a position relationship between the image positions of the pins and a geometric center position of the pick and place device.

26 Claims, 21 Drawing Sheets

(56) References Cited

U.S. PATENT DOCUMENTS

| | | | |
|---|---|---|---|
| 4,127,936 A * | 12/1978 | Schlup | H05K 13/0053 29/407.09 |
| 4,212,075 A | 7/1980 | Cleversey et al. | |
| 4,553,843 A | 11/1985 | Langley et al. | |
| 4,686,565 A | 8/1987 | Ando | |
| 4,727,471 A * | 2/1988 | Driels | B25J 9/1692 348/94 |
| 4,854,039 A | 8/1989 | Wendt | |
| 4,878,801 A | 11/1989 | Pearson | |
| 4,980,971 A | 1/1991 | Bartschat et al. | |
| 5,125,978 A | 6/1992 | Flynn et al. | |
| 5,416,335 A | 5/1995 | Forehand | |
| 5,953,804 A | 9/1999 | Dragotta | |
| 6,528,760 B1 | 3/2003 | Canella et al. | |
| 6,538,244 B1 | 3/2003 | Skunes | |
| 6,608,320 B1 * | 8/2003 | Skunes | G01B 11/024 250/559.19 |
| 6,610,991 B1 | 8/2003 | Case | |
| 6,653,727 B2 | 11/2003 | Hwang et al. | |
| 7,501,842 B2 | 3/2009 | Gleason et al. | |
| 7,518,387 B2 | 4/2009 | Gleason et al. | |
| 7,545,514 B2 | 6/2009 | Manickam et al. | |
| 7,609,077 B2 | 10/2009 | Campbell et al. | |
| 7,813,559 B2 * | 10/2010 | Duquette | G06K 9/00 382/151 |
| 7,876,114 B2 | 1/2011 | Campbell et al. | |
| 8,135,208 B1 | 3/2012 | Vangal-Ramamurthy | |
| 2003/0197263 A1 | 10/2003 | Hwang et al. | |
| 2005/0219829 A1 | 10/2005 | Lee | |
| 2007/0080703 A1 * | 4/2007 | Ding | G01N 21/95684 324/750.07 |
| 2008/0317575 A1 * | 12/2008 | Yamazaki | G01R 31/2893 414/754 |
| 2010/0305756 A1 * | 12/2010 | Hoshikawa | H04N 5/23248 700/259 |

FOREIGN PATENT DOCUMENTS

| | | |
|---|---|---|
| CN | 101102663 | 1/2008 |
| TW | 213763 | 9/1993 |
| TW | M269454 | 7/2005 |
| TW | 200534754 | 10/2005 |
| TW | M346169 | 12/2008 |
| TW | M414656 | 10/2011 |
| WO | 02/21105 A | 4/2002 |

OTHER PUBLICATIONS

Taiwan Patent Office, "Office Action", Aug. 27, 2014.
Time Minimum Trajectory Planning of a 2-DOF Translational Parallel Robot forPick-and-place Operations T Huang CIRP Annals 2007.
Industrial Machine Vision System for Fast and Precise 3D Object Localization O Demuynck Proceeding ISCGAV'09 Proceedings of the 9th WSEAS international conference 2009.
Automatic IC orientation checks AA Kassim Machine Vision and Applications 2000 P107.
Automatic PCB Inspection Algorithms A Survey M Moganti Computer Vision and Image Understanding archive 1996.
The Optimal Focus Measure for PassiveAutoFocusing and Depth-from-Focus M Subbarao Proceedings of SPIE conferenceon Videometrics IV 1995.
A survey of surface mount device placement machine optimization: Machine classification M Ayob European Journal of OperationalResearch 2008.

* cited by examiner

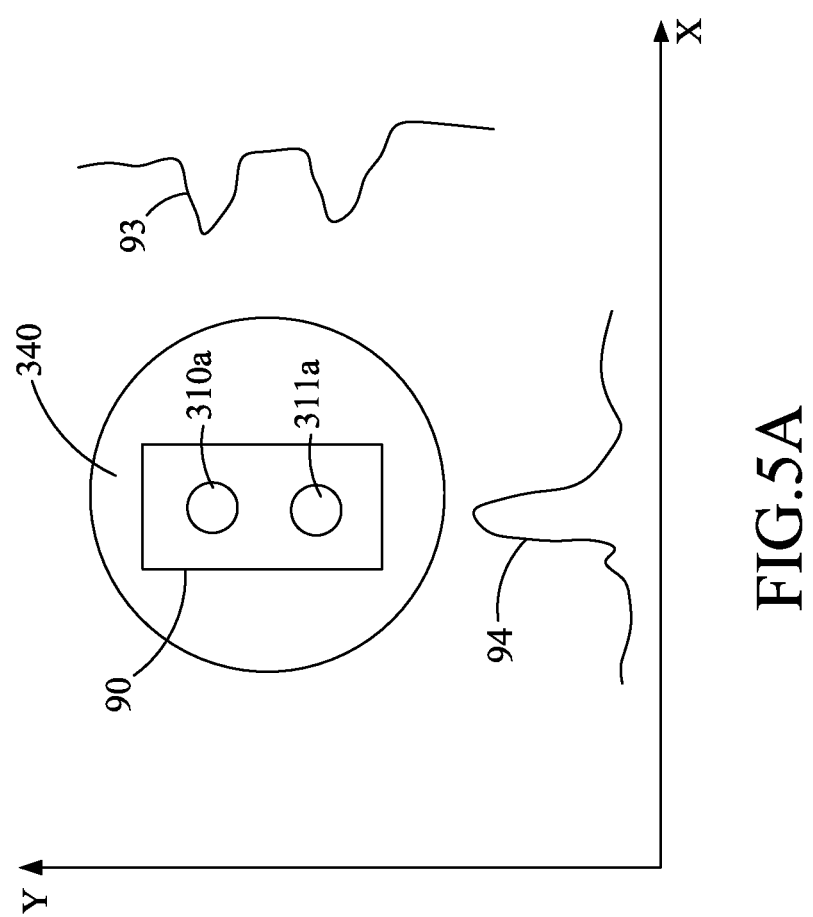

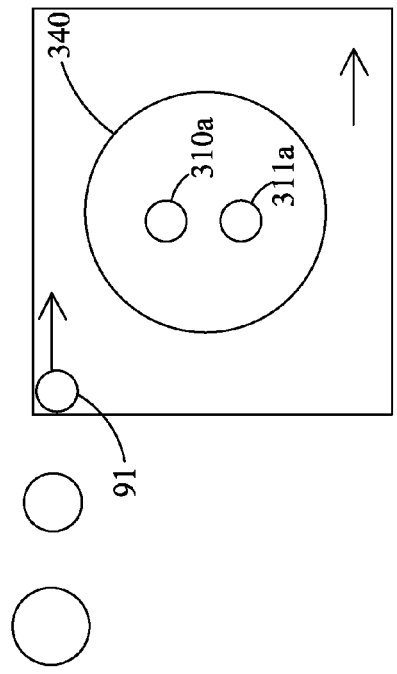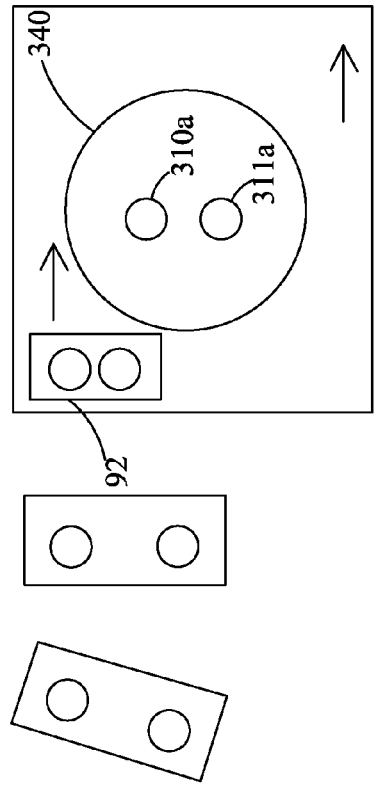

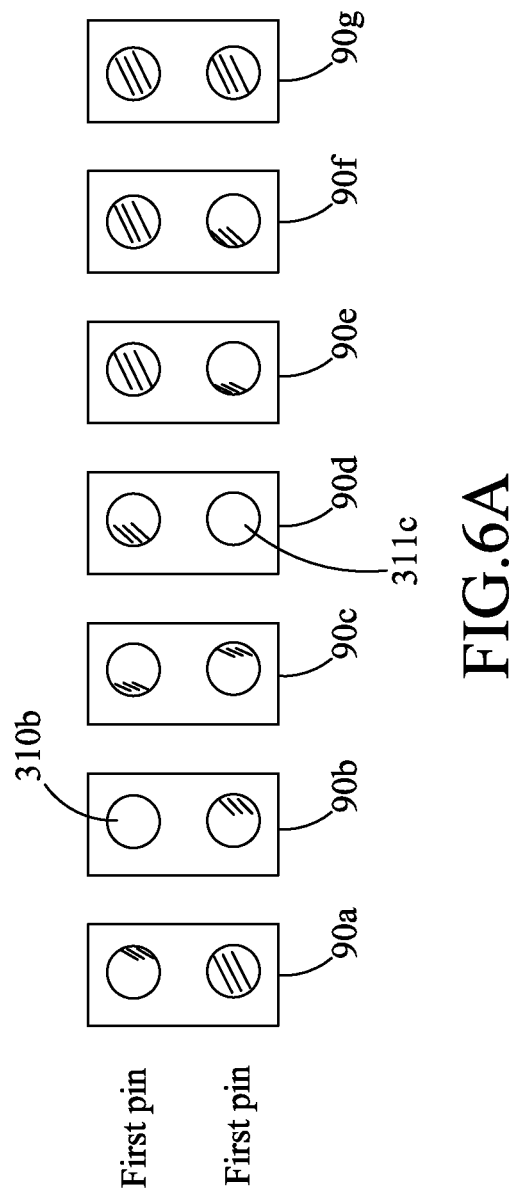

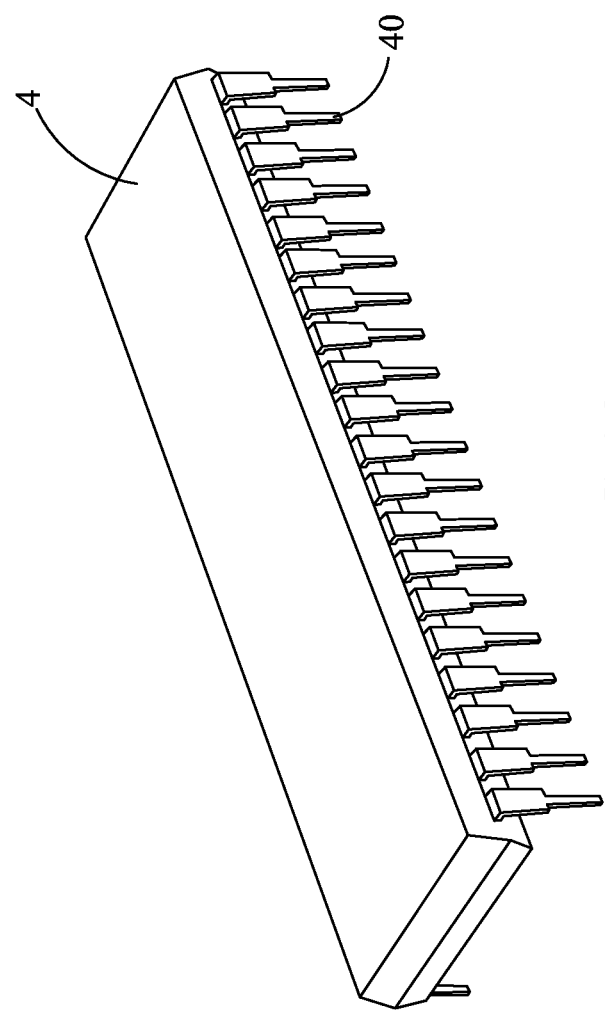

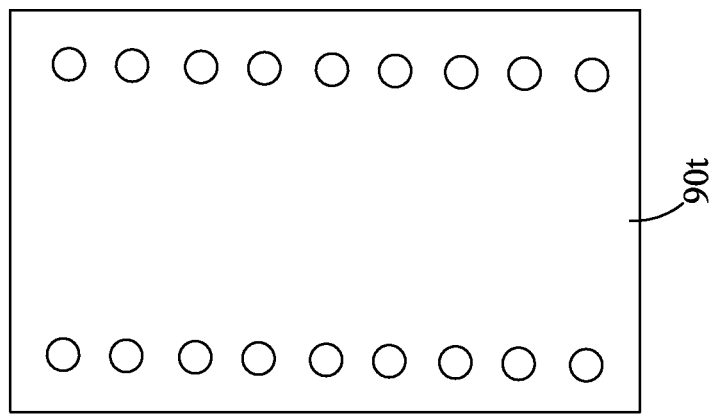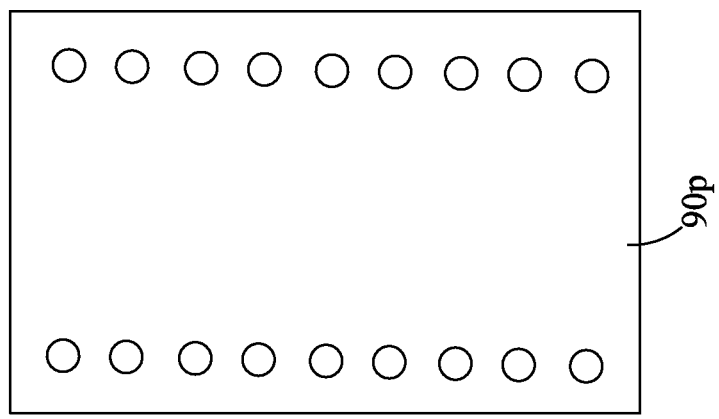
FIG.12A

METHOD FOR PINS DETECTION AND INSERTION OF ELECTRONIC COMPONENT

CROSS-REFERENCE TO RELATED APPLICATIONS

This application claims priority to Taiwanese Patent Application No. 101141808, filed on Nov. 9, 2012.

TECHNICAL FIELD

The disclosure relates to pins identification and insertion technologies, and in particular, to a method and system for pins detection and insertion of an electronic component.

BACKGROUND

Generally, production of electronic products includes the steps of component assembly, mechanism assembly, testing and delivery. Components in the component assembly are classified to surface mount devices (SMDs) and dual-in-line packages (DIPs). Owing to a small size and a high functional density, the SMD becomes the priority for component packaging. However, components used for high-voltage and large-current products must be packaged through DIP. The SMD component has a fixed size and is easy to pick and place automatically, so a lot of devices thereof are available and little manual labor is required. The appearance and size of the DIP component vary a lot, and the DIP component is difficult to pick and place. Therefore, few devices thereof are available, and great manual labor is required.

In the known art, during the mass production of electronic components using DIP, a cutting process is first performed to form independent electronic components, and then the electronic components are transported to a tray for bearing electronic components and arranged in sequence. Then the electric component is picked by a robotic arm in an automatic manner, and an insertion process is further performed to insert the electronic component to a corresponding position on a circuit board. In the foregoing insertion process, in order to ensure a smooth insertion process, positions of pins of the electronic component are detected through image processing in the known art, so as to estimate whether the positions of the pins exceed an allowable insertion range. However, after the cutting process, the electronic component may have problems such as an uneven surface or an error in the length of the pins, or the pins are deformed or bent as the electronic components push and squeeze each other during packing and delivery. All these situations affect a subsequent judgment result of whether the electronic component is qualified for the insertion process.

SUMMARY

In an embodiment, the disclosure provides a method for pins detection and insertion of an electronic component, comprising: picking an electronic component having a first pin and a second pin by a pick and place device; acquiring a plurality of serial images with respect to the first pin and the second pin at different height along an image acquiring direction by an image acquiring device; separately detecting image positions corresponding to the first pin and the second pin in the plurality of serial images; determining whether the electronic component is qualified according to a distance between the image positions of the first pin and the second pin; and if the electronic component is qualified, inserting the electronic component to a circuit board according to a position relationship between the image positions of the first pin and the second pin and a geometric center position of the pick and place device.

In another embodiment, the disclosure further provides a method for pins detection and insertion of an electronic component, comprising: picking an electronic component having a plurality of pins by a pick and place device; acquiring a plurality of serial images with respect to the plurality of pins at different height along an image acquiring direction by an image acquiring device; separately detecting image positions corresponding to the pins in the plurality of serial images; determining a position state according to the image positions of each pin, so as to determine whether the electronic component is qualified, and if the electronic component is qualified, inserting the electronic component to a circuit board according to a position relationship between the image positions of the pins and a geometric center of the pick and place device.

In an embodiment, the disclosure provides a system for pins detection and insertion of an electronic component, comprising: an image acquiring device; a pick and place device, used for picking an electronic component having a first pin and a second pin; and a control unit, electrically connected to the pick and place device and the image acquiring device, wherein the control unit controls the image acquiring device to acquire a plurality of serial images with respect to the first pin and the second pin at different height along an image acquiring direction, and separately detects image positions corresponding to the first pin and the second pin in the plurality of serial images; the control unit then determines whether the electronic component is qualified according to a distance between the image positions of the first pin and the second pin, and if the electronic component is qualified, controls the pick and place device to insert the electronic component to a circuit board according to a position relationship between the image positions of the first pin and the second pin and a geometric center of the pick and place device.

In another embodiment, the disclosure provides a system for pins detection and insertion of an electronic component, comprising: an image acquiring device; a pick and place device, used for picking an electronic component having a plurality of pins; and a control unit, electrically connected to the pick and place device and the image acquiring device, wherein the control unit controls the image acquiring device to acquire a plurality of serial images with respect to the plurality of pins at different height along an image acquiring direction, and separately detects image positions corresponding to the pins in the plurality of serial images; the control unit then determines a position state according to the image positions of each pin so as to determine whether the electronic component is qualified, and if the electronic component is qualified, controls the pick and place device to insert the electronic component to a circuit board according to a position relationship between the image positions of the pins and a geometric center of the pick and place device.

BRIEF DESCRIPTION OF DRAWINGS

FIG. 5A is a schematic view of detecting an interest region through projection;

FIG. 5B is a schematic view of detecting an interest region through geometric matching;

FIG. 5C is a schematic view of detecting an interest region through pattern matching;

FIG. 6A to FIG. 6B are schematic views of interest images of the serial images according to the disclosure;

FIG. 10B is a schematic view of an electronic component having multiple pins;

FIG. 12A is a schematic view of an interest region of each serial image;

DETAILED DESCRIPTION

Figure 1:
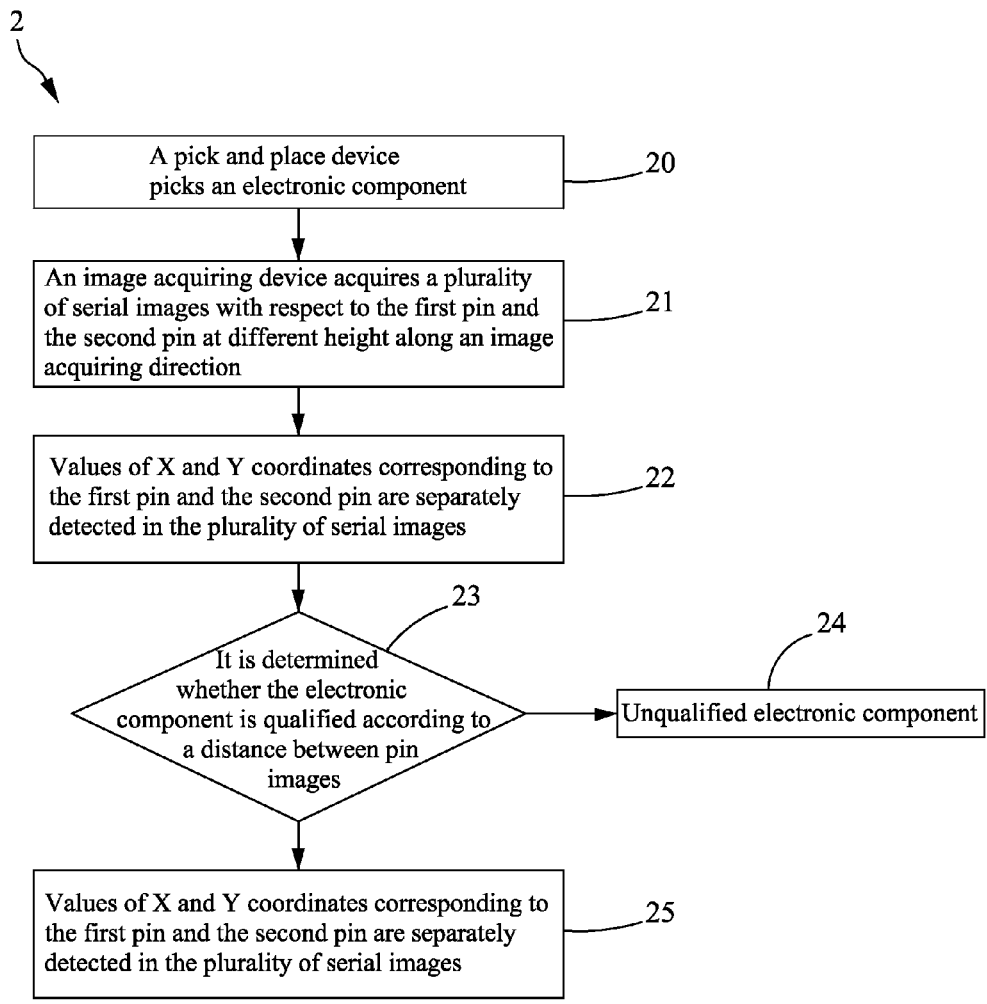
FIG. 1 is a schematic flow chart of a method for pins detection and insertion of an electronic component according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure provides a method and system for pins detection and insertion of an electronic component. The method includes acquiring serial images with respect to pins of an electronic component at different height as height of the electronic component changes, separately detecting pin images with a largest area in the serial images, and then detecting a geometric center of the pin image with a largest area to determine whether a pin position is abnormal. The method of the disclosure analyzes pin deformation of the electronic component, or problems of uneven length and an uneven surface on the image intensity after a cutting process, so as to reduce the insertion error of the electronic component on a circuit board and improve the yield of insertion.

Figure 2:
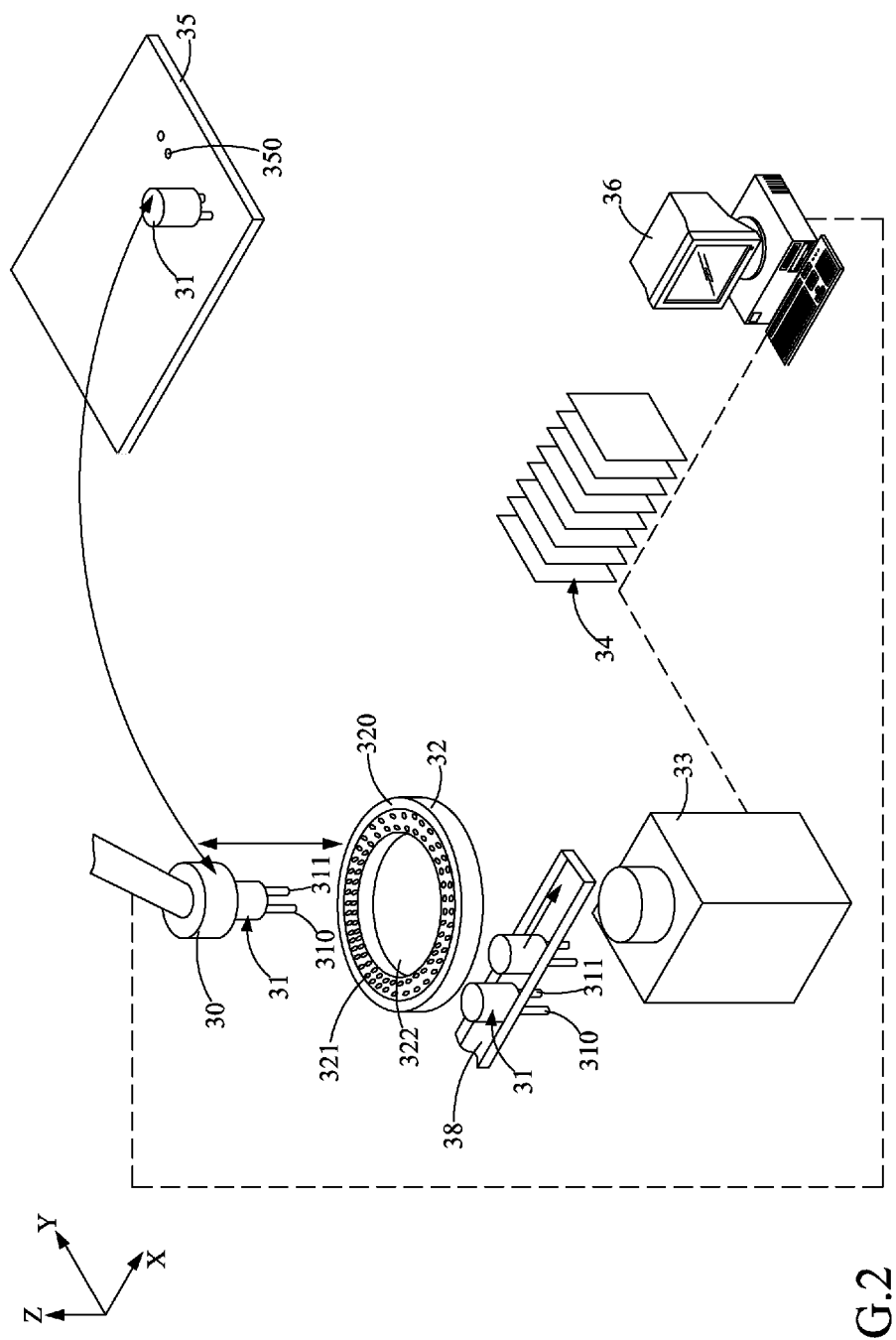
FIG. 2 is a schematic view of an embodiment of an insertion system of an electronic component.

Referring to FIG. 1 and FIG. 2, FIG. 1 is a schematic flow chart of a method for pins detection and insertion of an electronic component according to an embodiment of the disclosure; FIG. 2 is a schematic view of an insertion system of an electronic component. The process in FIG. 1 is controlled by a control unit 36. The control unit 36 may be a processor having an operational capability, such as a computer, a server or a programmable logic controller (PLC). In this embodiment, the method 2 includes the following steps: In Step 20, a pick and place device 30 picks an electronic component 31. In this embodiment, the electronic component 31 is a DIP electronic component and has a first pin 310 and a second pin 311. The electronic component 31 is disposed on a bearing tray 38. The pick and place device picks the electronic component 31 from the bearing tray. The first pin 310 and the second pin 311 each have an extending direction, which is a direction Z in this embodiment.

Then in Step 21, an image acquiring device 33 acquires a plurality of serial images 34 with respect to the first pin 310 and the second pin 311 at different height along an image acquiring direction (which is an axial direction Z in this embodiment). The image acquiring direction is substantially parallel to the extending direction of the first pin 310 or the second pin 311. The serial images are images of pins of the electronic component 31 sequentially picked by the pick and place device 30 when the height of the electronic component 31 increases or decreases on the axis Z. Therefore, each image in the plurality of serial images corresponds to respective height. In an alternative embodiment, the images correspond to different height are all in a depth of field range where the image acquiring device can acquire clear images.

In Step 21, acquiring the plurality of images of the pins, namely, the serial images 34 may be implemented in two manners. One implementation manner is shown in FIG. 2. The image acquiring device 33 is directly disposed below the bearing tray 38, so when the pick and place device 30 picks or attracts the electronic component 31 from the bearing tray 38, the image acquiring device 33 acquires pin images at different height Z during a rising process, so as to form the plurality of serial images 34 corresponding to different height. In FIG. 2, an annular light source 32 is further disposed at a corresponding picking or attraction position. The annular light source 32 has an annular body 320, and a plurality of light emitting components 321, such as light emitting diodes, in annular arrangement is disposed thereon. The annular body 320 has a hollow portion 322. An axis when pick and place device 30 picks the electronic component 31 and rises may correspond to a center of the hollow portion 322. The light emitting components 321 in annular arrangement may evenly illuminate the first pin 310 and the second pin 311 below the electronic component 31 around 360 degrees. It should be noted that, the position of the annular light source 32 may be above or below the image acquiring device 33, and is not limited to the embodiment shown in the figure. In addition, the light source is not limited to the annular light source shown in FIG. 2. Other proper light sources can be selected according to requirements.

Figure 3:
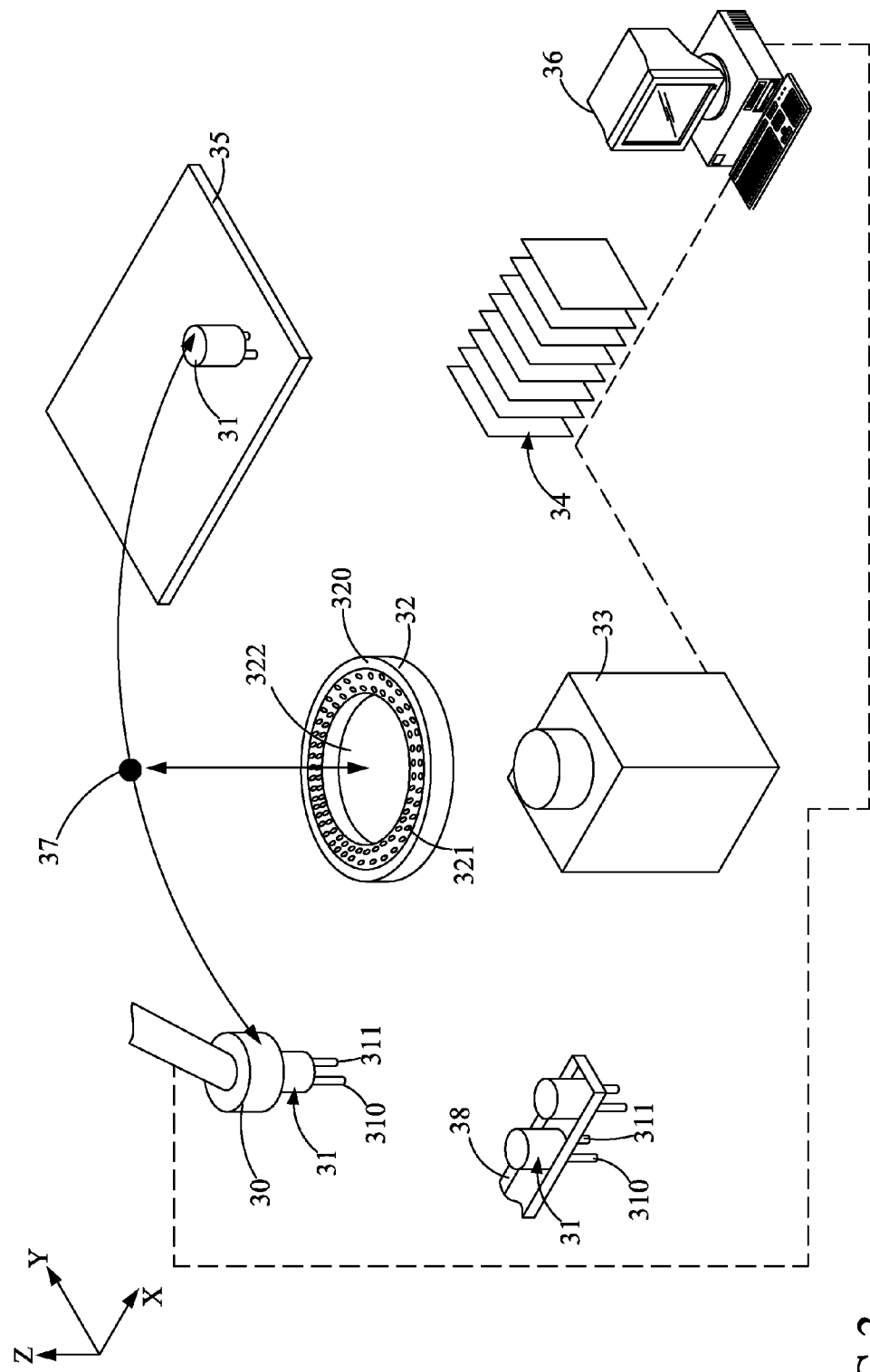
FIG. 3 is a schematic view of another embodiment of an insertion system of an electronic component.

Besides, in another embodiment, as shown in FIG. 3, the image acquiring device 33 and the annular light source 32 are disposed on a specific position of a path along which the pick and place device 30 moves to a circuit board 35. For example, in FIG. 3, when the pick and place device 30 picks or attracts the electronic component 31 from the bearing tray 38, at a position 37, the pick and place device 30 may further move downward or upward to generate different height on the axis Z, so that the image acquiring device 33 acquires images with respect to the first pin 310 and the second pin 311 of the electronic component 31, thereby generating a plurality of serial images 34. It should be noted that the images may be picked when the pick and place device 30 moves downward or upward.

Figure 4A:
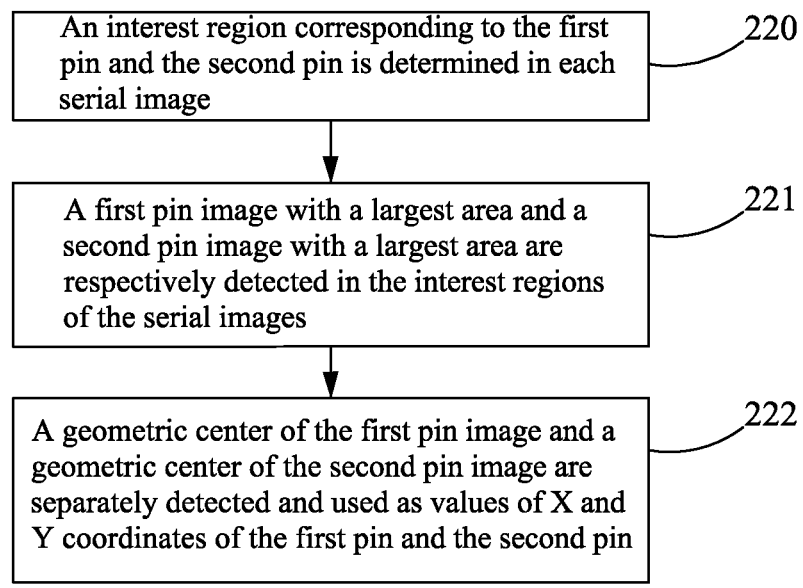
FIG. 4A is a schematic flow chart of a first embodiment for detecting image positions corresponding to the first pin and the second pin according the disclosure.

Referring to FIG. 1 and FIG. 2 again, after Step 21, in Step 22, image positions corresponding to the first pin and the second pin are separately detected in the plurality of serial images. In this step, a first pin image with a largest area and a second pin image with a largest area are separately detected in the plurality of serial images. As being detected separately, the first pin image with a largest area and the second pin image with a largest area do not necessarily appear in the same serial image. Referring to FIG. 4A, FIG. 4A is a schematic flow chart of a first embodiment for detecting image positions corresponding to the first pin and the second pin according to the disclosure. First, in Step 220, an interest region corresponding to the first pin and the second pin is determined in each serial image. The interest region may be found through projection, geometric matching or pattern matching.

Referring to FIG. 5A, FIG. 5A is a schematic view for detecting an interest region through projection. An image 340 represents each of the serial images. Through projection, each pixel may be used as an interval unit of an axial direction X and an axial direction Y to accumulate gray scale values of the image in the axial direction X and the axial direction Y, forming a state shown in a curve 93 and a curve 94. Approximate positions of the first pin image 310a and the second pin image 311a are determined through finding peak values of the curve 93 and the curve 94, thereby further determining an interest region covering the first pin image 310a and the second pin image 311a. Referring to FIG. 5B, FIG. 5B is a schematic view of geometric matching. In this embodiment, samples 91 corresponding to different sizes of sections of the pins are used to detect positions corresponding to the pin image 310a and the pin image 311a in each serial image 340. Further, as shown in FIG. 5C, pattern matching may be used for searching. In this embodiment, combination samples 92 of sections of the first and second pins with different sizes, distances and angles are used to compare with the first pin image 310a and the second pin image 311a in each serial image 340, so as to determine approximate positions of the first pin image 310a and the second pin image 311a, and further determine an interest region covering the first pin image and the second pin image. In an embodiment, the image position may be represented by X and Y coordinates.

Referring to FIG. 4A again, after the interest region is determined on each serial image, in Step 221, a first pin image with a largest area and a second pin image with a largest area are detected in the interest regions of the serial images. Referring to FIG. 6A, FIG. 6A is a schematic view of interest images of the serial images according to the disclosure. In FIG. 6A, interest regions 90a to 90g respectively correspond to the serial images, and a slash part represents a dark area. In Step 221, the largest area refers to the number of pixels with brightness greater than a threshold in images corresponding to the first pin and the second pin in the interest region. It should be noted that, in this embodiment, binaryzation processing may be first performed on images in the interest area. The binaryzation processing is to compare a gray scale value of each pixel with a threshold value. If the gray scale value exceeds the threshold value, the pixel is a bright spot (with a gray value of 225); if the gray scale value is lower than the threshold value, the pixel is regarded as a dark spot (with a gray scale value of 0). The area of the first pin and the area of the second pin are then determined according to the number of pixels with the gray scale value being 225.

In another embodiment, if no binaryzation processing is performed, the area is determined according to a relationship between the gray value and the threshold value, that is, determined according to the number of pixels exceeding the threshold value. FIG. 6A is taken as an example in this embodiment. The first pin image 310b in the interest region 90b and the second pin image 311c in the interest region 90d have the largest area, and therefore can be used to represent the first pin and the second pin. The characteristic of this embodiment is that the brightness of the first pin and the brightness of the second pin are separately considered. Therefore, no threshold value needs to be set to select pin images. In this way, good pin images can be acquired, facilitating subsequent determination of the geometric center of the pin, thereby improving the accuracy rate in determining whether an electronic pin is qualified.

Figure 7:
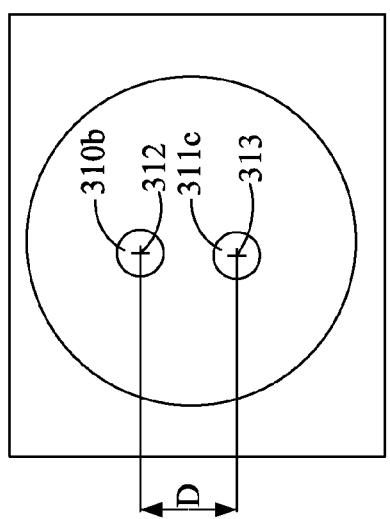
FIG. 7 is a schematic view of a relationship of pin images in an overlapped image.

Referring to FIG. 4A again, finally, in Step 222, a geometric center of the first pin image and a geometric center of the second pin image are separately detected and used as image positions of the first pin and the second pin. FIG. 7, which is a schematic view of overlapped first pin and second pin, is taken as an example. In the overlapped image, mark number 310b and mark number 311c respectively represent the first pin image with a largest area and the second pin image with a largest area detected in Step 221. Through geometric operations on the images, a geometric center 312 of the first pin image 310b and a geometric center 313 of the second pin image 311c are used as image positions of the first pin and the second pin. The image position may be represented by X and Y coordinates.

Figure 4B:
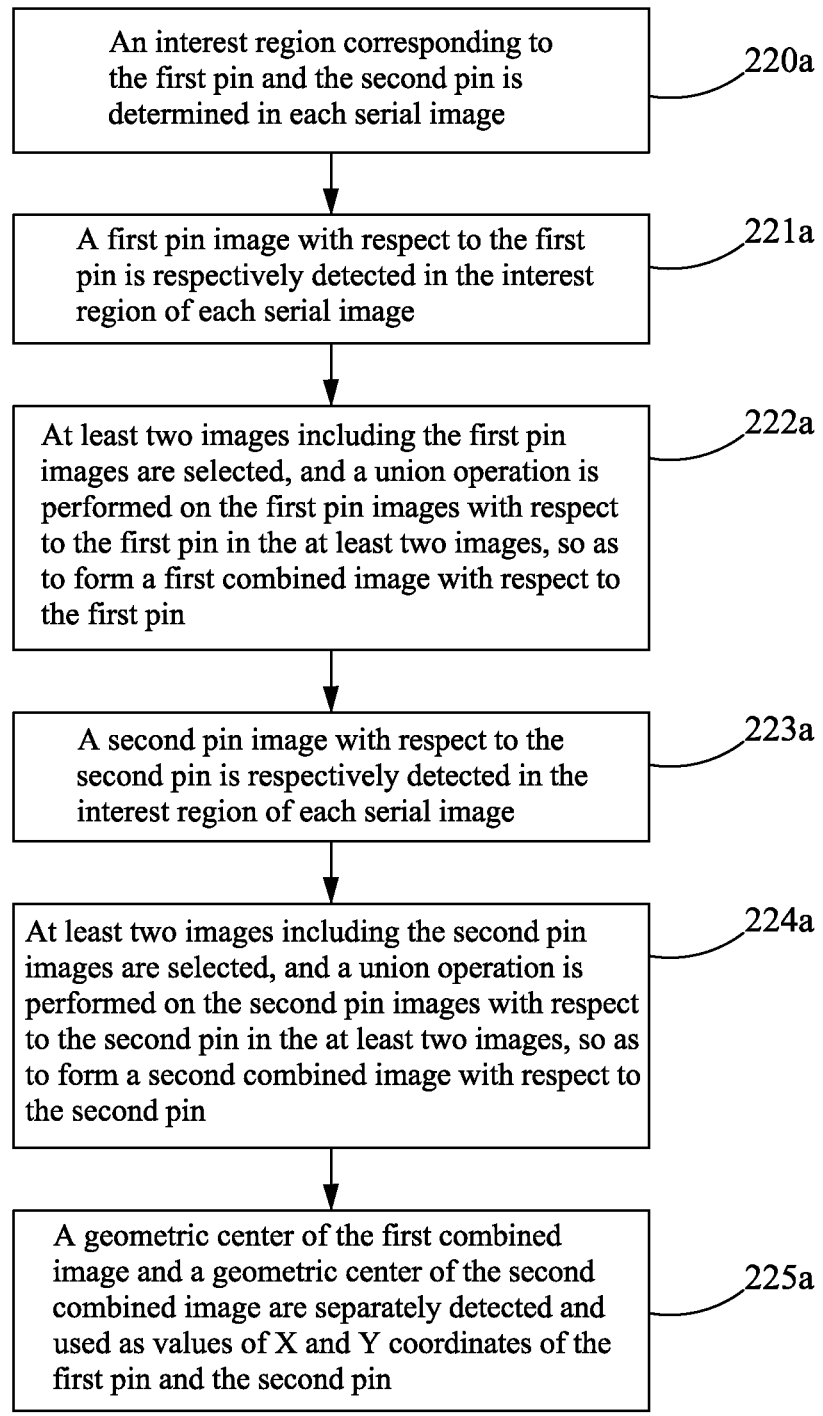
FIG. 4B is a schematic flow chart of a second embodiment for detecting image positions corresponding to the first pin and the second pin according the disclosure.
Figure 6B:
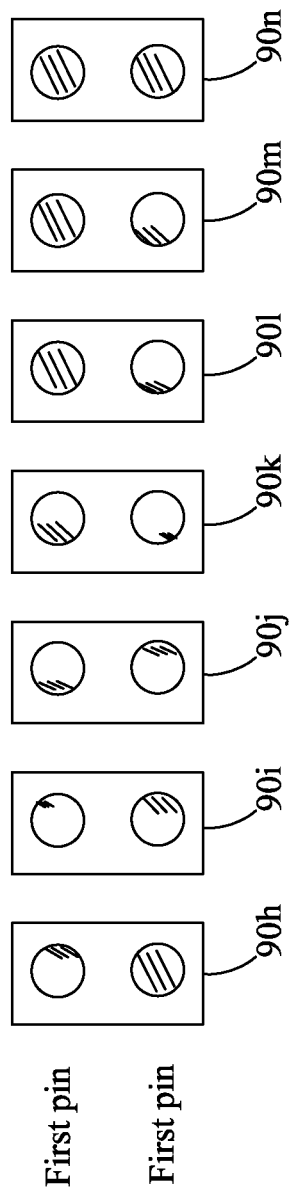

FIG. 4A shows one implementation manner for detecting image positions of the first pin and the second pin. In another embodiment, FIG. 4B shows a schematic flow chart of a second embodiment for detecting image positions corresponding to the first pin and the second pin according to the disclosure. Different from detecting a largest pin image in FIG. 4A, in FIG. 4B, a largest pin image is formed through superposition. First, in Step 220, an interest region corresponding to the first pin and the second pin is determined in each serial image. Step 220a is the same as the foregoing Step 220, and is not described herein again. Then, in Step 221a, a first pin image with respect to the first pin is respectively detected in the interest region of each serial image. Then, in Step 222a, at least two serial images including the first pin images with respect to the first pin detected in the interest regions corresponding to the serial images are selected, and a union operation is performed on the first pin images with respect to the first pin in the at least two images, so as to form a first combined image with respect to the first pin. In Step 222a, as shown in FIG. 6B, the images with respect to the first pin and the second pin in each interest region are incomplete, and a slash region represents a dark area. Therefore, through Step 222a, the union operation is performed on the images with respect to the first pin in the interest regions in at least two serial images so as to form a first pin image with a largest area. For example, for the first pin part, the union operation is performed on first pin images in the interest region 90h and the interest region 90i, so as to obtain a superposed image with respect to the first pin.

Then, in Step 223a, a second pin image with respect to the second pin is respectively detected in the interest region of each serial image. Then in Step 224a, at least two images including the second pin images are selected, and a union operation is performed on the second pin images with respect to the second pin in the at least two images, so as to form a second combined image with respect to the second pin. Still, FIG. 6B is used for description. For the second pin part, the union operation may be performed on second pin images in the interest region 90j and the interest region 90k, so as to obtain a superposed image with respect to the second pin. Then, in Step 225a, a geometric center of the first combined image and a geometric center of the second combined image are separately detected and used as image positions of the first pin and the second pin.

After the geometric centers of the first pin image and the second pin image are detected, referring to FIG. 1 and FIG. 2 again, in Step 23, it is determined whether the electronic component is qualified according to a distance between the image positions of the first pin and the second pin. Referring to FIG. 7, the geometric center 312 of the first pin image 310b and the geometric center 313 of the second pin image 311c are already determined, so a distance D between the two pins can be determined. If D exceeds or is lower than an acceptable threshold value or range, it indicates that the electronic component 31 cannot be smoothly inserted to a corresponding pin contact 350 on the circuit board 35, and therefore the electronic component 31 regarded as unqualified in Step 24 and is eliminated. If D is in the acceptable range, it indicates that the electronic component 31 can be smoothly inserted to the corresponding pin contact 350 on the circuit board 35, and therefore the electronic component is qualified.

Finally, in Step 25, the electronic component 31 is inserted to the circuit board 35 according to a position relationship between the image positions of the first pin 310 and the second pin 311 and a geometric center of the pick and place device 30. Referring to FIG. 2, when the pick and place device 30 attracts or picks the electronic component 31, the center of the electronic component 31 does not always correspond to the center of the pick and place device 30, and an error may be generated. Therefore, even if D satisfies the determination in Step 23 of FIG. 1, the insertion may still fail due to an error in the position relationship between the pick and place device 30 and the electronic component 31. Therefore, in Step 25, the position relationship between the image positions of the first pin 310 and the second pin 311 and the geometric center of the pick and place device 30 may be compensated, so as to ensure that the electronic component is smoothly inserted to the corresponding circuit board.

Figure 8:
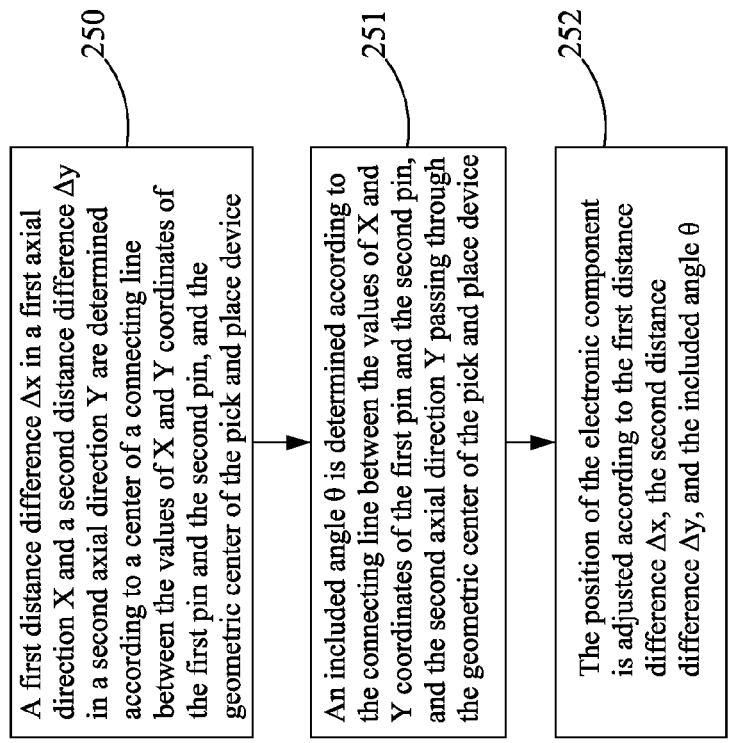
FIG. 8 is a schematic flow chart of inserting the electronic component to a circuit board according to a position relationship between the first and second pins and the geometric center of the pick and place device in accordance with the disclosure.

Referring to FIG. 8, FIG. 8 is a schematic flow chart of inserting the electronic component to the circuit board according to the position relationship between the first and second pins and the geometric center of the pick and place device in accordance with the disclosure. In order to precisely insert the electronic component to the circuit board, in Step 250 of this method, a first distance difference $\Delta x$ in a first axial direction X and a second distance difference $\Delta y$ in a second axial direction Y are determined according to a center of a connecting line between the image positions of the first pin and the second pin, and the geometric center of the pick and place device. Then in Step 251, an included angle $\theta$ is determined according to the connecting line between the image positions of the first pin and the second pin, and the second axial direction Y passing through the geometric center of the pick and place device 30. Finally, in Step 252, the position of the electronic component is adjusted according to the first distance difference $\Delta x$, the second distance difference $\Delta y$, and the included angle $\theta$.

Figure 9A:
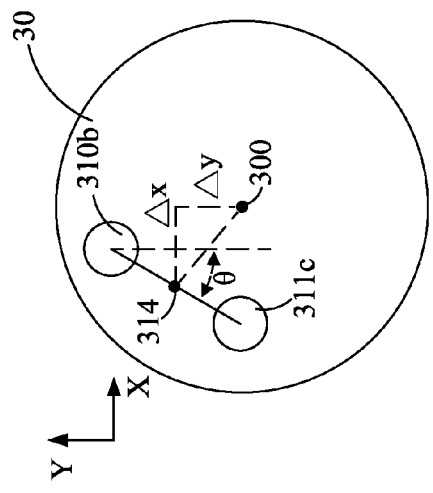
FIG. 9A to FIG. 9C are schematic views of position relationships between pins of a qualified electronic component and a pick and place device.
Figure 9B:
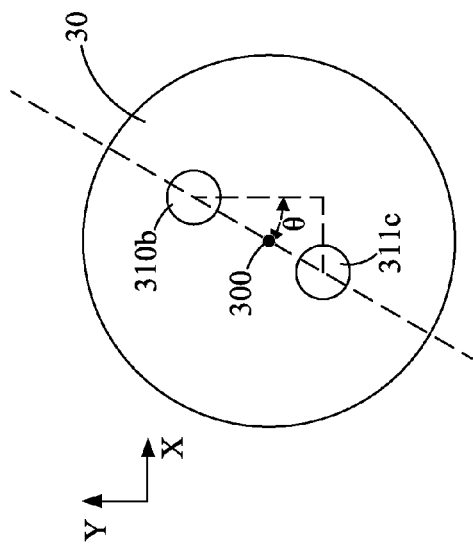
Figure 9C:
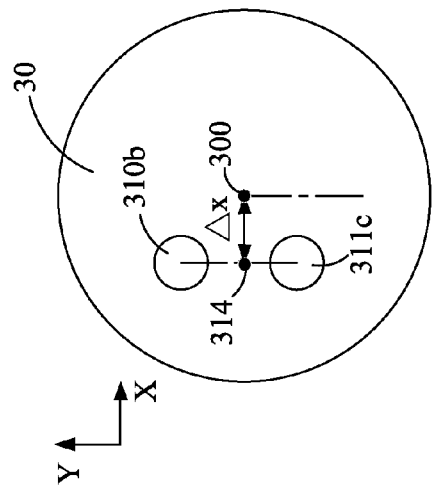

The process in FIG. 8 is described with reference to FIG. 2 and FIG. 9A to FIG. 9C. FIG. 9A to FIG. 9C are schematic views of position relationships between pins of a qualified electronic component and a pick and place device. The position relationship between the pins of the electronic component 31 and the pick and place device 30 may have a single direction shift as shown in FIG. 9A. In this embodiment, a middle point 314 of the connecting line between the geometric centers of the first pin image 310b and the second pin image 311c has a difference $\Delta x$ in a direction X with the geometric center 300 of the pick and place device. As shown in FIG. 9B, an angle error exists between the electronic component and the pick and place device, that is, the connecting line between the geometric centers of the first pin image 310b and the second pin image 311c, and a reference line passing through the geometric center 300 of the pick and place device 30 and parallel to the axis Y form an included angle $\theta$. Alternatively, in the case of rotation plus shift as shown in FIG. 9C, that is, the middle point 314 of the connecting line between the geometric centers of the first pin image 310b and the second pin image 311c has a difference $\Delta x$ in a direction X and a difference $\Delta y$ in a direction Y with the geometric center 300 of the pick and place device 30; moreover, the connecting line between the geometric centers of the first pin image 310b and the second pin image 311c, and a reference line passing through the geometric center 300 of the pick and place device 30 and parallel to the axis Y form an included angle $\theta$.

In the state shown in FIG. 9A, the control unit 36 controls the pick and place device 30 to move to compensate the distance of $\Delta x$, so that the pick and place device 30 smoothly inserts the electronic component 31 to the circuit board 35. In the state shown in FIG. 9B, the control unit 36 controls the pick and place device 30 to rotate to compensate $\theta$ degrees, so that the pick and place device 30 smoothly inserts the electronic component 31 to the circuit board 35. In the state shown in FIG. 9C, the control unit 36 controls the pick and place device 30 to move in the direction X and direction Y to respectively compensate the distance of $\Delta x$ and the distance of $\Delta y$, and controls the pick and place device 30 to rotate anticlockwise to compensate $\theta$ degrees, so that the pick and place device 30 smoothly inserts the electronic component 31 to the circuit board 35.

Figure 10A:
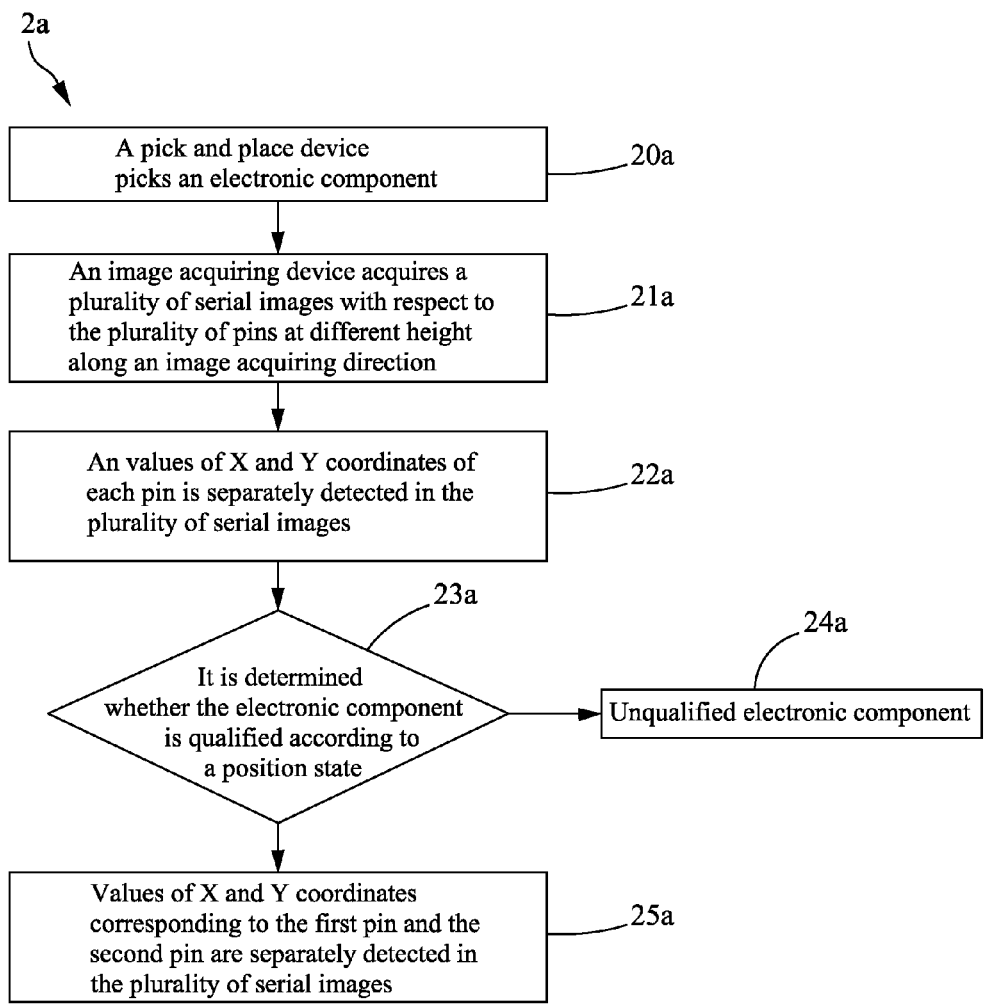
FIG. 10A is a schematic flow chart of a method for pins detection and insertion of an electronic component according to another embodiment of the disclosure.
Figure 11A:
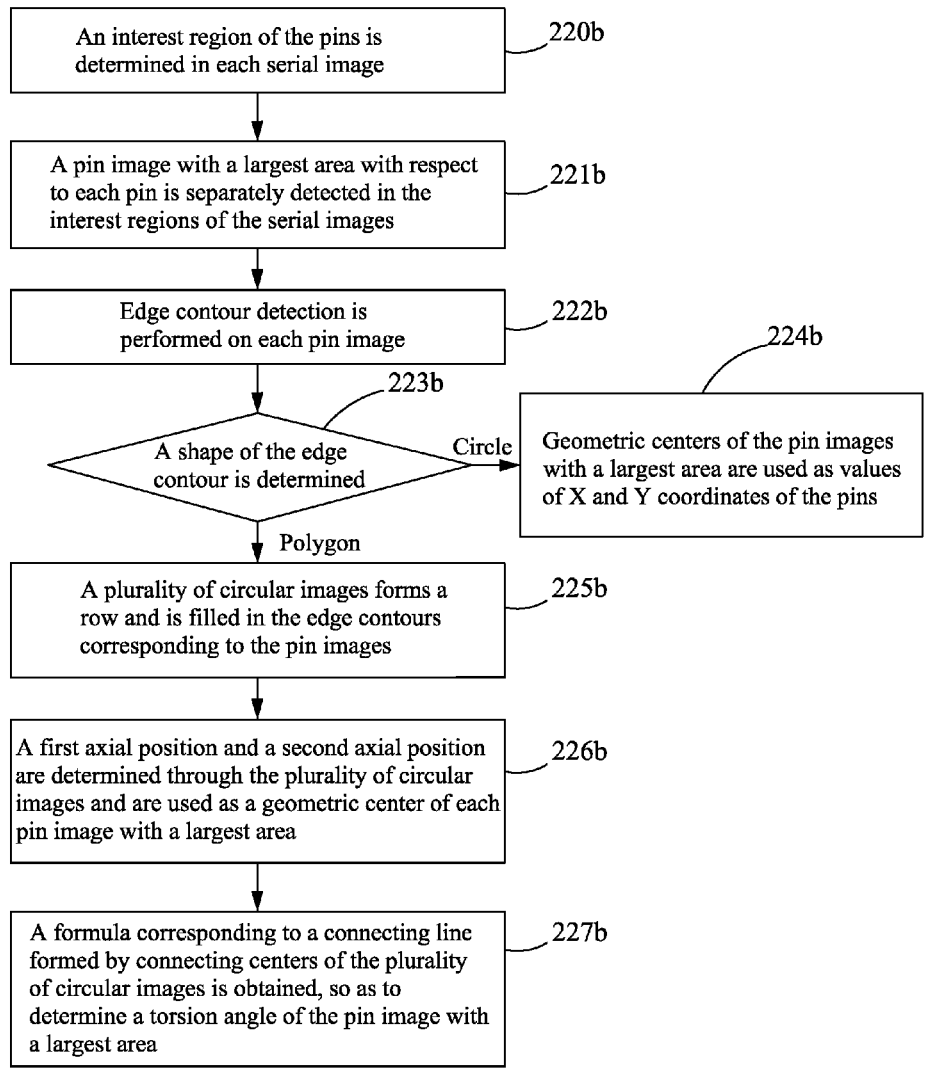
FIG. 11A is a schematic flow chart of an embodiment for detecting an image positions of each pin according to the disclosure.

Referring to FIG. 10A, FIG. 10A is a schematic flow chart of a method for pins detection and insertion of an electronic component according to another embodiment of the disclosure. This embodiment is mainly directed to multiple pins such as an electronic component 4 having multiple pins 40, and to a process of identification and insertion according to pins with different sections. The process of Step 20a and Step 21a in the method 2a is the same as Step 20 and Step 21 in FIG. 1, and is not described herein again. In Step 22a, an image position of each pin is separately detected in a plurality of serial images. Referring to FIG. 11A, FIG. 11A is a schematic flow chart of an embodiment for detecting an image position of each pin according to the disclosure. In this embodiment, in Step 220b, an interest region of the pins is determined in each serial image. In Step 220b, approximate positions of the pins are detected in each serial image through projection, geometric matching or pattern matching as shown in FIG. 5A to FIG. 5C, so as to determine an interest region.

Then in Step 221b, a pin image with a largest area with respect to each pin is separately detected in the interest regions of the serial images. This step is substantially the same as the manner shown in FIG. 6A, and the different merely lies in that, the number of pins is two in FIG. 6A, and a plurality of pins in two rows exists in this embodiment. As shown in FIG. 12A, mark number 90p to mark number 90t represent interest regions of the serial images. Each interest region has a plurality of pins, and the size of a pin varies in different interest regions, so based on the manner described in foregoing Step 221, a pin image with a largest area corresponding to each pin is separately detected in the plurality of interest regions.

Figure 12C:
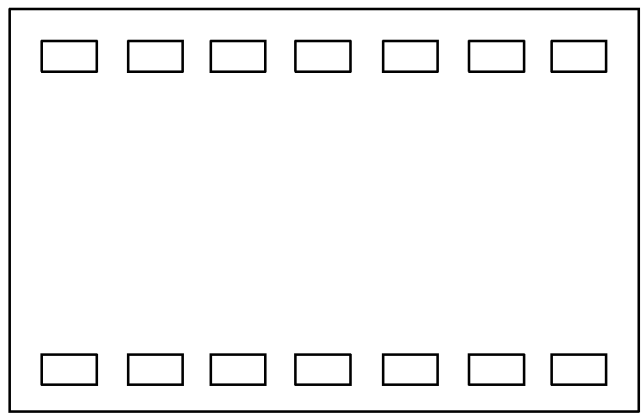
FIG. 12B and FIG. 12C are schematic views of edge shapes of pins in a combined image.
Figure 12B:
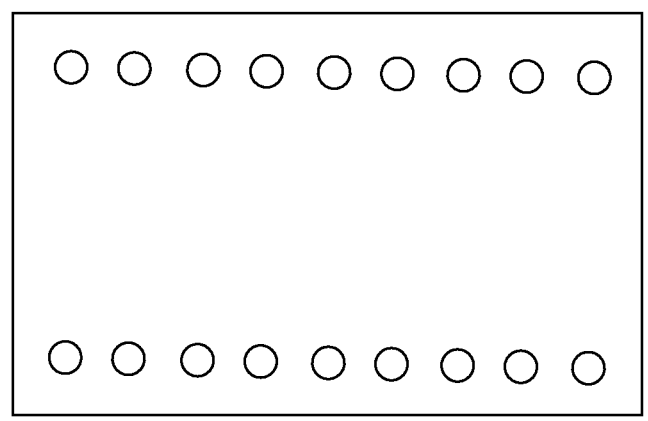

Referring to FIG. 11A again, in Step 222b, edge contour detection is performed on each pin image. In this step, an edge contour of the pin image with a largest area in Step 221b is detected. After that, in Step 223b, a shape of the edge contour is determined. Referring to FIG. 12B and FIG. 12C, the edge contour of each pin in the combined image may be a circle as shown in FIG. 12B, or a polygon as shown in FIG. 12C. In the embodiment in FIG. 12C, the polygon is a rectangle.

Figure 13A:
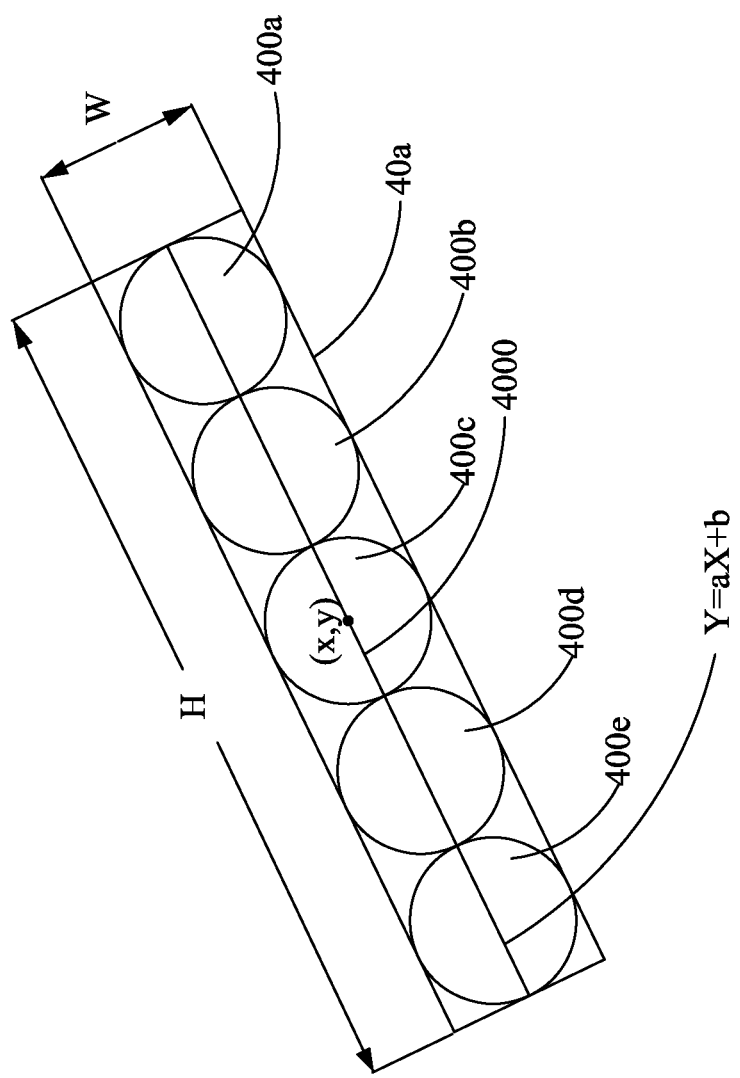
FIG. 13A and FIG. 13B are schematic views of an edge contour of a pin.
Figure 13B:
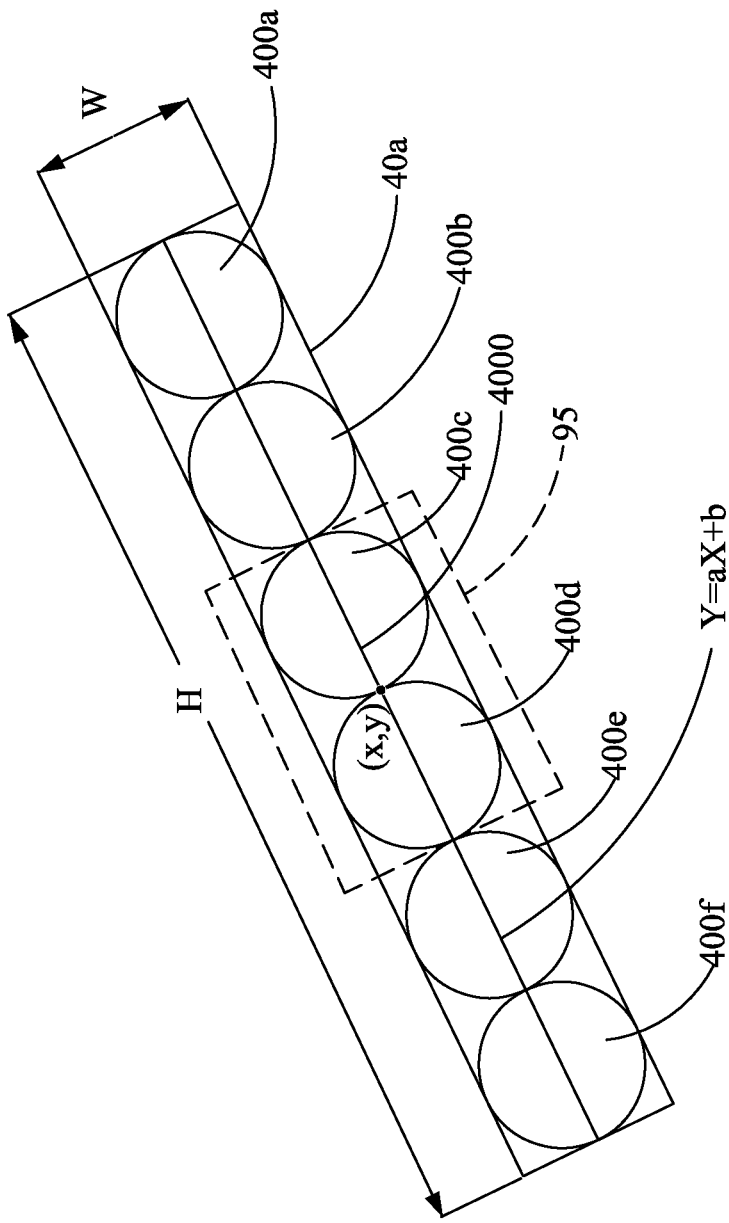

If the edge contour is a circle as shown in FIG. 12, Step 224b is performed, in which geometric centers of the pin images with a largest area are used as image positions of the pins. Step 224b is the same as the foregoing Step 222, and is not described herein again. If the edge contour is a rectangle, Step 225b is performed, in which a plurality of circular images forms a row and is filled in the edge contours corresponding to the pin images. Referring to FIG. 13A and FIG. 13B, FIG. 13A and FIG. 13B are schematic views of edge contours of a pin image 40a (corresponding to the pin 40 in FIG. 10B). In this embodiment, in order to detect the geometric center of the pin image, a plurality of circular images 400a to 400e formed with the width W of the pin image 40a as a diameter is filled in the edge contour. During the filling process, the first circular image 400a is tangent with a side of the pin image 40a, and other circular images 400b to 400e are subsequently arranged in the pin image 40a in order in a tangency manner. Then in Step 226b, a first axial position and a second axial position are determined through the plurality of circular images and are used as a geometric center of each pin image with a largest area. In Step 226b, FIG. 13A is taken as an example. The number of the plurality of circular images 400a to 400e is an odd number (which is 5 in this embodiment). Therefore, in this embodiment, the manner for determining the geometric center of the pin image with a largest area may be using a center (x, y) of the circular image 400c corresponding to the median of the plurality of circular images to represent the first axial and second axial position of the pin image. In addition, FIG. 13B is taken as an example. In the embodiment where the number of the plurality of circular images is an even number, a central point (x, y) of a connecting lines between centers of two circular images 400c and 400d in a central region 95 of the plurality of circular images 400a to 400f is used to represent the first axial and second axial position of the pin image with a largest area. It should be noted that, in the embodiment where the number of the plurality of circular images is an even number, as the median is not an integer, the two circular images in the central region 95 are respectively a ceiling and a floor closest to the median number, and the central point (x, y) of the connecting line between the centers of the two circular images 400c and 400d corresponding to the ceiling and floor is used to represent the first axial and second axial position of the pin image with a largest area.

Referring to FIG. 11A again, after the first axial and second axial position are determined, in Step 227b, a formula corresponding to a connecting line formed by connecting centers of the plurality of circular images is obtained, so as to determine a torsion angle of the pin image with a largest area. For a non-circular pin, the insertion is not only affected by a distance between adjacent pins but also by the torsion of the pin body. Therefore, in this step, torsion determination is performed on non-circular edge contours. The rectangular edge contour in FIG. 13 is taken as an example. It is determined whether the pin is twisted according to a slope of a line segment connecting centers of the circular images filled in the rectangular contour. Therefore in Step 227b, a formula of the line segment is determined through curve fitting, so as to obtain the slope thereof and a torsion state of the electronic component, thereby determining whether the electronic component can be inserted to the circuit board.

Figure 14A:
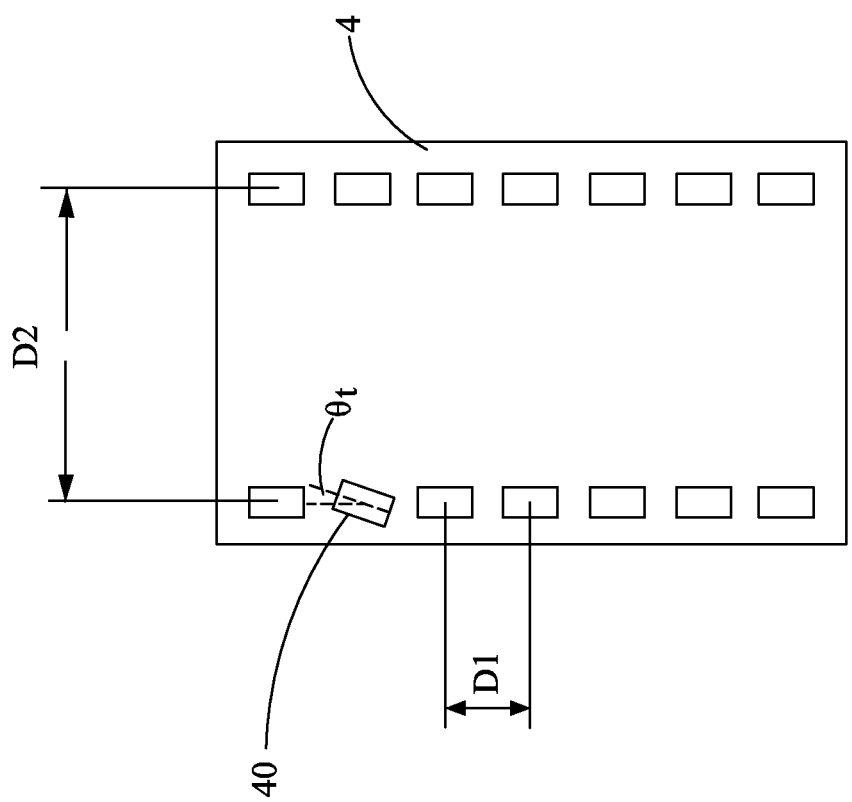
FIG. 14A is a schematic view of a bottom image of an electronic component having a plurality of non-circular pin contours.

Referring to FIG. 10A again, after Step 22b, in Step 23a, a position state is determined according to the image position of each pin, so as to determine whether the electronic component is qualified. This step is similar to Step 23 FIG. 1, and the difference is that in this step, apart from the distance between geometric centers of two adjacent pins, the position state also includes the torsion angle of the pin for non-circular pins, so as to determine whether the electronic component can be inserted smoothly. For the electronic component having a plurality of pins arranged in two rows shown in FIG. 14A, if distances D1 and D2 between geometric centers of two adjacent pins exceed or are lower than an acceptable threshold value or range, the electronic component is unqualified. However, as the pin contour is rectangular, even if the distances D1 and D2 between geometric centers are within the acceptable range, the insertion may still fail due to the torsion angel thereof. The pin 40 in FIG. 14A leads to an insertion failure due to a torsion angle $\theta_t$ thereof. So in Step 228b, determining the torsion angle according to the slope through a formula formed in a curve fitting manner is the basis for determining a non-circular pin. In Step 23a, if distances D1 and D2 between geometric centers of adjacent circular pins exceed or are lower than an acceptable threshold value range, and if distances D1 and D2 between geometric centers of adjacent non-circular pins exceed or are lower than an acceptable range or a non-circular pin has a torsion angle $\theta_t$, it is determined in Step 24a that the electronic component is unqualified.

Figure 14B:
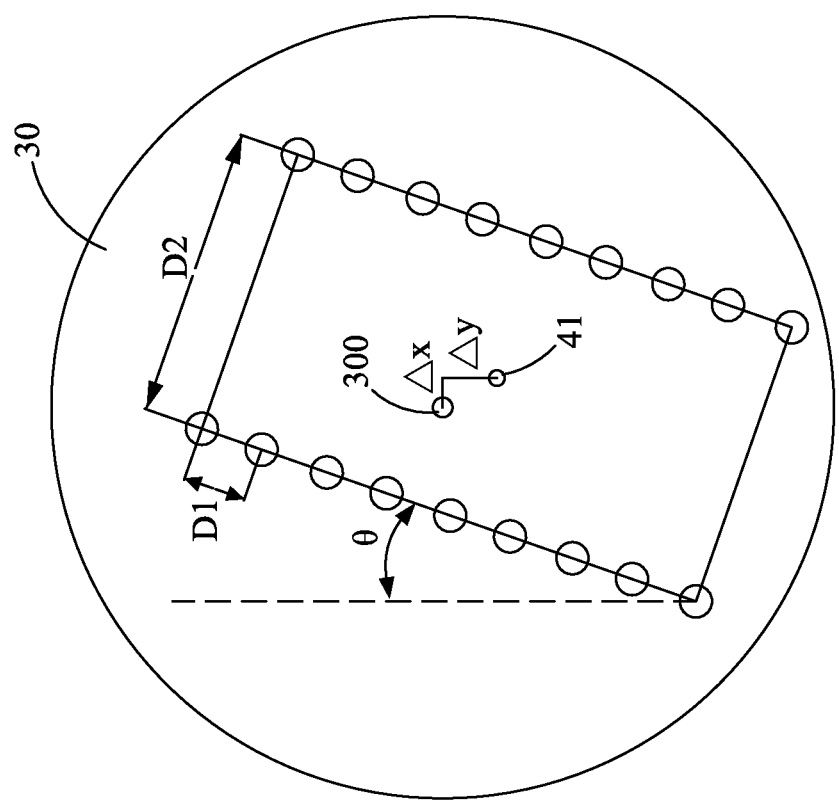
FIG. 14B is a schematic view of compensation according to a position relationship.

After it is determined that the electronic component is qualified in Step 23a, finally, in Step 25a, the electronic component is inserted to a circuit board according to a position relationship between the image positions of the pins and the geometric center of the pick and place device. Referring to FIG. 14B, for the position relationship in Step 25a, position compensation may be performed according to a distance difference Δx in a direction X and a distance difference Δy in a direction Y between an alignment geometric center 41 of a region formed according to the connecting line of the pins and the geometric center 300 of the pick and place device 30, and according to an included angle θ between a row of pins and a reference line passing through the geometric center 300 of the pick and place device 30 and parallel to the axis Y. The principle thereof is shown in FIG. 9A to FIG. 9C, and is not described herein again. In addition, it should be noted that pins shown in FIG. 14B are circular pins, however, the same manner applies to non-circular pins.

Figure 11B:
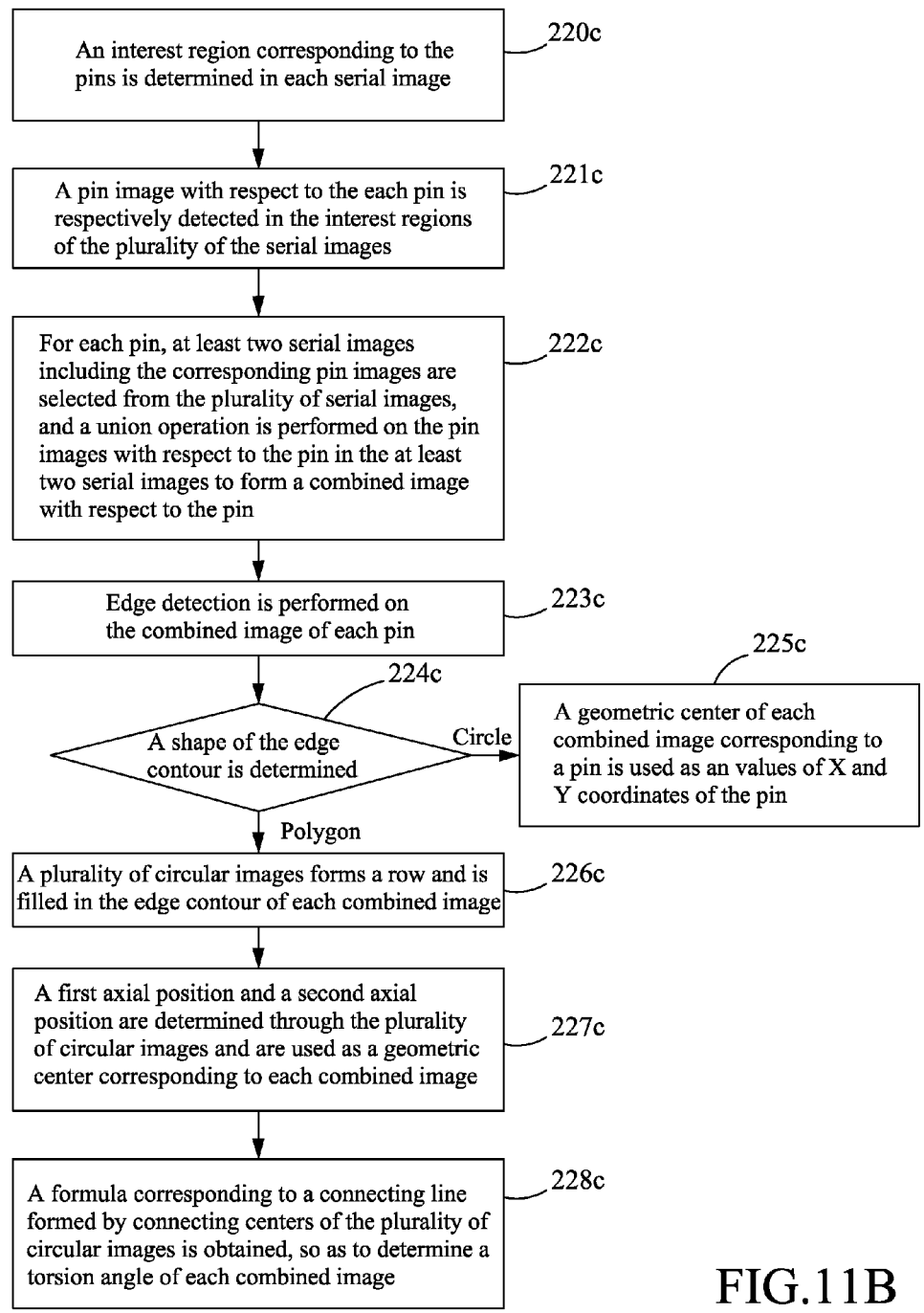
FIG. 11B is a schematic flow chart of another embodiment for detecting an image positions of each pin according to the disclosure.

Referring to FIG. 11B, FIG. 11B is a schematic flow chart of another embodiment for detecting an image position of each pin according to the disclosure. Step 220c to Step 222c in the process shown in FIG. 11B are similar to Step 220a to Step 224a, that is, at least two images of each pin are selected separately from interest regions of a plurality of serial images for recombination, and each pin image in the recombined image has a largest area. Then, in Step 223c, an edge detection is performed on each pin image in a manner shown in Step 222b of FIG. 11A, which is not described herein again. After the edge contour of each pin is detected, in Step 224c, a shape of the edge contour is determined. If the edge contour is a circle, Step 225c is performed, in which a geometric center of each combined image corresponding to a pin is used as an image position of the pin. The manner of Step 225c is the same as the process shown in FIG. 4B, and is not described herein again. If the pins are polygonal, Step 226c to Step 228c are performed to determine whether the electronic component is qualified. The process of Step 226c to Step 228c in FIG. 11B is similar to Step 225b to Step 227b in FIG. 11A, and the difference is that the image in FIG. 11A is a pin image with a largest area, and the image in FIG. 11B is a combined image; all others are the same, which are not described herein again.

The embodiments are merely for explaining the characteristics and efficacy of the disclosure, and are not intended to limit the application range of the disclosure. Any equivalent variation and modification made without departing from the spirit and scope of the disclosure are intended to be included within the scope of the following claims.

What is claimed is:

1. A method for pins detection and insertion of an electronic component, comprising:
   picking an electronic component having a plurality of pins by a pick and place device;
   acquiring a plurality of serial images with respect to the plurality of pins at different height along an image acquiring direction by an image acquiring device;
   separately detecting image positions corresponding to the pins in the plurality of serial images;
   determining a position state according to the image positions of each pin, so at to determine whether the electronic component is qualified; and
   if the electronic component is qualified, inserting the electronic component to a circuit board according to a position relationship between image positions of the pins and a geometric center of the pick and place device;
   wherein, detecting the image positions corresponding to the pins further comprises:
     determining an interest region with respect to each pin in each serial image;
     separately detecting a pin image with a largest area with respect to each pin in interest regions of the serial images;
     performing edge contour detection on each pin image with a largest area; and
     determining a shape of the edge contour.

2. The method for pins detection and insertion of an electronic component according to claim 1, wherein the detecting the image positions corresponding to the pins further comprises:
   if the edge contour is substantially a circle, using geometric centers of the pin images as the image positions of the pins.

3. The method for pins detection and insertion of an electronic component according to claim 2, wherein the determining the position state so as to determine whether the electronic component is qualified further comprises:
   determining a distance between two adjacent pins according to the geometric centers of the pin images; and
   determining whether the electronic component is qualified according to a value of the distance.

4. The method for pins detection and insertion of an electronic component according to claim 1, wherein the detecting the image positions corresponding to the pins further comprises:
   if the edge contour is substantially a rectangle, forming a plurality of circular images into a row and filling the row to the edge contour of each pin image with a largest area; and
   determining a first axial position and a second axial position through the plurality of circular images and using the first axial position and the second axial position as a geometric center of each pin image with a largest area.

5. The method for pins detection and insertion of an electronic component according to claim 4, wherein the determining the first axial position and the second axial position through the plurality of circular images further comprises:
   when the number of the plurality of circular images is an odd number,
   using a center of a circular image corresponding to a median of the plurality of circular images as the geometric center corresponding to each pin image with a largest area.

6. The method for pins detection and insertion of an electronic component according to claim 4, wherein the determining the first axial position and the second axial position through the plurality of circular images further comprises:
   when the number of the plurality of circular images is an even number,
   using a center of a connecting line between centers of two central circular images of the plurality of circular images as the geometric center corresponding to each pin image with a largest area.

7. The method for pins detection and insertion of an electronic component according to claim 4, wherein the determining the position state so as to determine whether the electronic component is qualified further comprises:
   obtaining a formula corresponding to a connecting line formed by connecting centers of the plurality of circular images so as to determine a torsion angle of the pin image with a largest area;
   determining a distance between two adjacent pins according to the geometric centers of the pin images; and
   determining whether the electronic component is qualified according to a value of the distance and a value of the torsion angle.

8. The method for pins detection and insertion of an electronic component according to claim 1, wherein the inserting the electronic component to the circuit board according to the position relationship between the image positions of the pins and the geometric center of the pick and place device further comprises:
   determining an alignment geometric center according to the image positions of the plurality of the pins;
   determining a first distance difference in a first axial direction and a second distance difference in a second axial direction according to the alignment geometric center and the geometric center of the pick and place device;
   determining an included angle according to a connecting line between the image positions corresponding to any two adjacent pins and the second axial direction passing through the geometric center of the pick and place device; and adjusting a position of the electronic component according to the first distance difference, the second distance difference, and the included angle.

9. The method for pins detection and insertion of an electronic component according to claim 1, wherein the image acquiring device is disposed below the electronic component, and when the pick and place device picks the electronic component, the image acquiring device acquires the plurality of serial images.

10. The method for pins detection and insertion of an electronic component according to claim 1, wherein the image acquiring device is disposed on a path where the pick and place device moves the electronic component to the circuit board, the pick and place device picks the electronic component and moves the electronic component above the image acquiring device and moves up and down in the image acquiring direction, so that the image acquiring device acquires the plurality of serial images.

11. The method for pins detection and insertion of an electronic component according to claim 1, wherein the position state comprises a distance between adjacent pins, or a combination of the distance between adjacent pins and a torsion angle of each pin.

12. The method for pins detection and insertion of an electronic component according to claim 1, wherein the image acquiring direction is substantially parallel to an extending direction of one of the pins.

13. The method for pins detection and insertion of an electronic component according to claim 1, wherein the image position comprises X and Y coordinates.

14. A method for pins detection and insertion of an electronic component, comprising:
   picking an electronic component having a plurality of pins by a pick and place device;
   acquiring a plurality of serial images with respect to the plurality of pins at different height along an image acquiring direction by an image acquiring device;
   separately detecting image positions corresponding to the pins in the plurality of serial images;
   determining a position state according to the image positions of each pin, so as to determine whether the electronic component is qualified; and
   if the electronic component is qualified, inserting the electronic component to a circuit board according to a position relationship between image positions of the pins and a geometric center of the pick and place device;
   wherein, detecting the image positions corresponding to the pins further comprises:
      determining an interest region with respect to each pin in each serial image;
      respectively detecting pin images with respect to the pins in the interest regions of the plurality of serial images;
      for each pin, selecting at least two serial images comprising the corresponding pin images from the plurality of serial images, and performing a union operation on the pin images with respect to the pin in the at least two serial images to form a combined image with respect to the pin;
      performing detection of an edge contour on the combined image of each pin; and
      determining a shape of the edge contour.

15. The method for pins detection and insertion of an electronic component according to claim 14, wherein the detecting the image positions corresponding to the pins further comprises:
   if the edge contour is substantially a circle, using a geometric center of each combined image as the image positions of the corresponding pin.

16. The method for pins detection and insertion of an electronic component according to claim 15, wherein the determining the position state so as to determine whether the electronic component is qualified further comprises:
   determining a distance between two adjacent pins according to the image positions of the pins; and
   determining whether the electronic component is qualified according to a value of the distance.

17. The method for pins detection and insertion of an electronic component according to claim 14, wherein the detecting the image positions corresponding to the pins further comprises:
   if the edge contour is substantially a rectangle, forming the plurality of circular images into a row and filling the row in the edge contour of each combined image; and
   determining a first axial position and a second axial position according to at least one circular image corresponding to a median of the plurality of the circular images, and using the first axial position and the second axial position as a geometric center corresponding to the combined image of each pin.

18. The method for pins detection and insertion of an electronic component according to claim 17, wherein the determining the first axial position and the second axial position through the plurality of circular images further comprises:
   when the number of the plurality of circular images is an odd number,
   using a center of a circular image corresponding to the median of the plurality of circular images as the geometric center of the combined image corresponding to each pin.

19. The method for pins detection and insertion of an electronic component according to claim 17, wherein the determining the first axial position and the second axial position through the plurality of circular images further comprises:
   when the number of the plurality of circular images is an even number,
   using a center of a connecting line between centers of two central circular images of the plurality of circular images as the geometric center of the combined image corresponding to each pin.

20. The method for pins detection and insertion of an electronic component according to claim 17, wherein the determining the position state so as to determine whether the electronic component is qualified further comprises:
   obtaining a formula corresponding to a connecting line formed by connecting centers of the plurality of circular images so as to determine a torsion angle of the combined image corresponding to each pin;
   determining a distance between two adjacent pins according to the geometric centers of the combined images of the pins; and
   determining whether the electronic component is qualified according to a value of the distance and a value of the torsion angle.

21. The method for pins detection and insertion of an electronic component according to claim 14, wherein the inserting the electronic component to the circuit board according to the position relationship between the image positions of the pins and the geometric center of the pick and place device further comprises:
- determining an alignment geometric center according to the image positions of the plurality of the pins;
- determining a first distance difference in a first axial direction and a second distance difference in a second axial direction according to the alignment geometric center and the geometric center of the pick and place device;
- determining an included angle according to a connecting line between the image positions corresponding to any two adjacent pins and the second axial direction passing through the geometric center of the pick and place device; and
- adjusting a position of the electronic component according to the first distance difference, the second distance difference, and the included angle.

22. The method for pins detection and insertion of an electronic component according to claim 14, wherein the image acquiring device is disposed below the electronic component, and when the pick and place device picks the electronic component, the image acquiring device acquires the plurality of serial images.

23. The method for pins detection and insertion of an electronic component according to claim 14, wherein the image acquiring device is disposed on a path where the pick and place device moves the electronic component to the circuit board, the pick and place device picks the electronic component and moves the electronic component above the image acquiring device and moves up and down in the image acquiring direction, so that the image acquiring device acquires the plurality of serial images.

24. The method for pins detection and insertion of an electronic component according to claim 14, wherein the position state comprises a distance between adjacent pins, or a combination of the distance between adjacent pins and a torsion angle of each pin.

25. The method for pins detection and insertion of an electronic component according to claim 14, wherein the image acquiring direction is substantially parallel to an extending direction of one of the pins.

26. The method for pins detection and insertion of an electronic component according to claim 14, wherein the image position comprises X and Y coordinates.

* * * * *